(12) United States Patent
Chandramani et al.

(10) Patent No.: US 11,456,050 B2
(45) Date of Patent: Sep. 27, 2022

(54) RELINKING SCHEME IN SUB-BLOCK MODE

(71) Applicant: WESTERN DIGITAL TECHNOLOGIES, INC., San Jose, CA (US)

(72) Inventors: Chandramani, Bangalore (IN); Sagar Shirpimutt, Bangalore (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/184,375

(22) Filed: Feb. 24, 2021

(65) Prior Publication Data

US 2022/0270703 A1    Aug. 25, 2022

(51) Int. Cl.
| | |
|---|---|
| G11C 29/44 | (2006.01) |
| G11C 16/08 | (2006.01) |
| G11C 29/42 | (2006.01) |
| G11C 16/26 | (2006.01) |
| G11C 16/10 | (2006.01) |

(52) U.S. Cl.
CPC .............. *G11C 29/44* (2013.01); *G11C 16/08* (2013.01); *G11C 16/102* (2013.01); *G11C 16/26* (2013.01); *G11C 29/42* (2013.01)

(58) Field of Classification Search
CPC ......... G11C 29/44; G11C 29/42; G11C 16/08; G11C 16/102; G11C 16/26
See application file for complete search history.

(56) References Cited

U.S. PATENT DOCUMENTS

| | | | |
|---|---|---|---|
| 2005/0144361 A1* | 6/2005 | Gonzalez | G06F 12/0607 711/E12.079 |
| 2018/0203774 A1* | 7/2018 | Srinivasan | G11C 16/10 |
| 2019/0348129 A1* | 11/2019 | Chin | G11C 16/24 |

* cited by examiner

*Primary Examiner* — Sultana Begum
(74) *Attorney, Agent, or Firm* — ArentFox Schiff LLP

(57) ABSTRACT

Aspects of a storage device including a memory and a controller are provided which allow sub-blocks with different sub-block addresses to be linked across multiple planes to form metablocks. The memory includes multiple blocks in different planes, where each of the blocks includes multiple sub-blocks. The controller links a first sub-block in a first plane and a second sub-block in a second plane with different sub-block addresses to form the metablock. After forming the metablock, the controller programs different word lines in the first and second sub-blocks when writing data to the metablock. Thus, the controller may write data to linked or relinked metablocks with different sub-block addresses, thereby improving die yield and memory capacity of the storage device.

19 Claims, 16 Drawing Sheets

1500

1502
Link a First Sub-Block in a First Plane With a Second Sub-Block in a Second Plane to Form a Metablock 1504
Identify an Error in a Third Sub-Block in the First Plane and in a Fourth Sub-Block in the Second Plane 1506
Identify an Error in Other Metablocks Respectively Including the First Sub-Block and the Second Sub-Block 1508
Write Data to the Metablock 1510
Program a First Word Line in the First Sub-Block 1512
Subsequently Program a Second Word Line in the Second Sub-Block 1514
Program the Second Word Line Following a Program Failure in a Third Sub-Block

FIG. 15

RELINKING SCHEME IN SUB-BLOCK MODE

BACKGROUND

Field

This disclosure is generally related to electronic devices and more particularly to storage devices.

INTRODUCTION

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

Some of the blocks of the flash storage device may be factory marked bad blocks (FBBs) or grown bad blocks (GBBs) (together referred to herein as "bad blocks"). A FBB is a physical block which is identified to have at least a threshold number of read, program, or erase errors during manufacturer testing. Similarly, a GBB is a physical block which is identified to have at least a threshold number of read, program, or erase errors during the run time or life of the flash storage device. Examples of errors may include flipped bits (e.g., bits flipped from 0 to 1 or from 1 to 0 during programming) and program failures (e.g., where a number of program operations or loops required to program a memory cell exceeds a threshold). If during manufacturer testing, a threshold number of such errors are detected in a block, that block may be marked as a FBB and removed from usable memory. If a threshold number of blocks in a die are marked as FBBs, the die itself may be removed from usable memory, impacting die yield of the flash storage device. Similarly, if during run time, a threshold number of such errors are detected in a block, that block may be marked as a GBB and removed from usable memory, impacting the capacity of the flash storage device.

SUMMARY

One aspect of a storage device is disclosed herein. The storage device includes a memory and a controller. The memory includes a plurality of blocks in different planes, where each of the blocks includes a plurality of sub-blocks. The controller is configured to link a first one of the sub-blocks in a first one of the planes with a second one of the sub-blocks in a second one of the planes to form a metablock, where the first one of the sub-blocks and the second one of the sub-blocks are associated with different sub-block addresses.

Another aspect of a storage device is disclosed herein. The storage device includes a memory and a controller. The memory includes a plurality of blocks in different planes, where each of the blocks includes a plurality of sub-blocks. The controller is configured to program a word line in a first one of the sub-blocks in one of the planes and to program a different word line in a second one of the sub-blocks in another one of the planes, where the first one of the sub-blocks and the second one of the sub-blocks are parts of a metablock and include different sub-block addresses.

A further aspect of a storage device is disclosed herein. The storage device includes a memory and a controller. The memory includes a plurality of blocks in different planes, where each of the blocks includes a plurality of sub-blocks. The controller is configured to link a first one of the sub-blocks in one of the planes with a second one of the sub-blocks in another one of the planes to form a metablock, where the first one of the sub-blocks and the second one of the sub-blocks are associated with different sub-block addresses. The controller is further configured to program different word lines in the first one of the sub-blocks and the second one of the sub-blocks when writing data to the metablock.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIG. 15 is a flow chart illustrating a method for linking sub-blocks with different sub-block addresses to form metablocks and for writing data to a metablock using a two-stage programming sequence, as performed by the storage device of FIG. 1.

DETAILED DESCRIPTION

Figure 1:
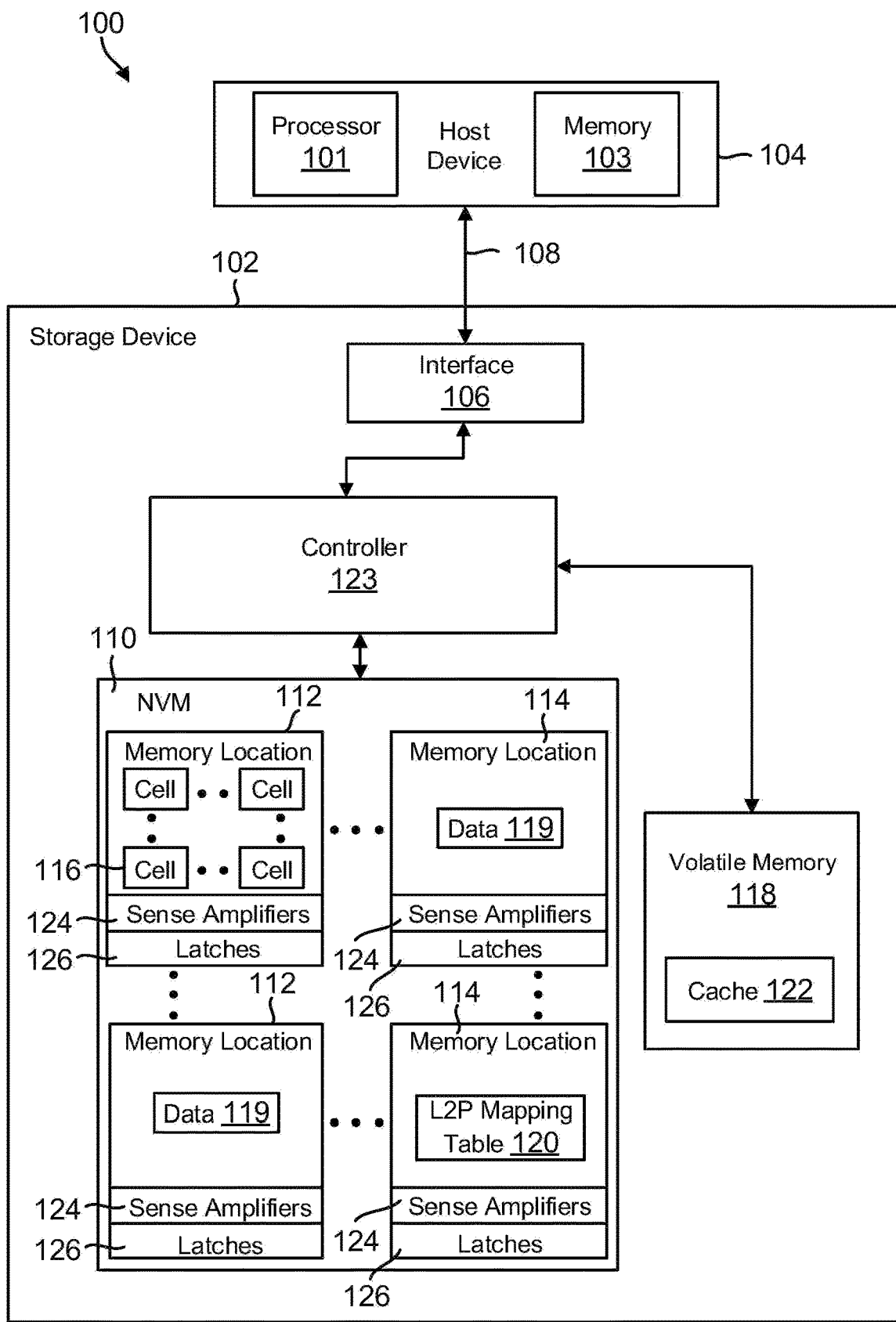
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

During manufacturer testing or run-time of the flash storage device, various physical blocks may be identified as bad blocks (e.g. FBBs or GBBs). To minimize the impact to die yield and memory capacity that may result from such bad blocks, physical blocks may be divided into sub-blocks. Generally, a physical block with N WLs may be divided into two sub-blocks each including N/2 WLs, where a first one of the sub-blocks include WLs [0 to (N/2)−1], and a second one of the sub-blocks include WLs [(N/2) to N−1]. For example, a physical block with 96 word lines (WLs) may be divided into two sub-blocks each including 48 WLs. Each sub-block may be separated by a memory hole joint including dummy word lines in a block of three-dimensional (3D) NAND memory. For instance, a 3-D NAND block with 96 WLs may have a memory hole joint separating the block into two sub-blocks, where one sub-block includes WLs 0-47 (Sub-Block 0 or SB0) and another sub-block includes WLs 48-95 (Sub-Block 1 or SB1). Moreover, each sub-block of a block may be independently readable, programmable, or erasable. For example, each sub-block may be coupled to a respective row decoder or other circuitry which allow different read, program, or erase voltages to be applied to the cells in different sub-blocks.

As a result, if a physical block is identified as a bad block due to an error within one sub-block (referred to herein as a bad sub-block) but not within another sub-block (referred to herein as an operable or error-free sub-block), a controller may still be able to read, write, or erase data in the operable sub-block. For instance, even if a block is identified to have a threshold number of flipped bits or program failures in one sub-block, the other sub-block may remain operational and independently readable, programmable and erasable. Sub-blocks may thus serve to prevent large reductions in memory capacity by preventing loss of the entire physical block in bad block scenarios, especially in flash storage devices with large physical blocks (e.g. 96 or more WLs).

Furthermore, blocks or sub-blocks across planes of one or more dies of flash memory may be logically linked to form metablocks. A metablock is a logical grouping of blocks or sub-blocks. Each metablock may be indicated by a single logical address which is mapped to one or more physical addresses of the blocks or sub-blocks, either directly or through intermediate logical addresses. For example, a metablock including multiple sub-blocks across different planes may be associated with a single logical address that is mapped to the logical addresses of each sub-block, and the logical address of each sub-block may be mapped to a physical address in memory. Moreover, if a physical block or sub-block in the metablock is later identified to be a bad block or bad sub-block, the controller may un-form the metablock and relink operable blocks or operable sub-blocks to form new metablocks. The linking and relinking of operable sub-blocks to form metablocks may prevent large reductions in memory capacity, for example, where a physical block is later identified as a bad block and there are insufficient numbers of physical blocks available to form new metablocks.

Generally, metablocks only include sub-blocks sharing the same sub-block address (e.g., SB0 or SB1). For example, a metablock including multiple sub-blocks across planes may include SB0s (e.g., WLs 0-47) or SB1s (e.g., WLs 48-95), but not both SB0s and SB1s. This constraint reflects typical operation of flash storage devices in which the controller may issue a single command to program cells on the same word line but not on different word lines. For example, during a NAND write operation, if the controller intends to write data to a third word line of each sub-block in a metablock (e.g., WL 2 for SB0 or WL 50 for SB1), the controller may issue a single command to program cells on the WL 2s of SB0s across planes or on the WL 50s of SB1s across planes. In contrast, the controller may not issue a single command to program cells on the third word line of both SB0s and SB across planes, since WL2 and WL50 are different word lines.

As a result of this same sub-block address constraint on metablock formation, the controller may not be able to relink operable sub-blocks to form new metablocks in response to identification of bad sub-blocks. For instance, if one metablock having only SB0s across planes is un-formed due to a bad sub-block in a particular plane, the operable SB0s cannot be relinked with an SB1 in that plane to form a new metablocks. Instead, the controller is constrained to relink the operable SB0s with a spare SB0 in that plane, unless no spare SB0s are available in which case the controller may not be able to form new metablocks. Such constraint on metablock relinking over time may lead to a reduction of die yield if, for example, at least one plane has a large number of bad sub-blocks. Such constraint may also lead to the flash storage device entering a read only (RO) mode due to reduction in memory capacity from bad sub-blocks.

To prevent such impact to die yield and memory capacity, the controller in the present disclosure may link SB0s and SB1s across multiple planes to form metablocks. For instance, if one metablock having only SB0s across planes and another metablock having only SB1s across planes are both un-formed due to bad sub-blocks, the controller may link the SB0s and SB1s together to form a new metablock. In this way, the controller may reclaim metablocks that otherwise may have been lost due to bad sub-blocks. Moreover, when the controller writes data to such a linked metablock (including SB0s and SB1s), the controller may issue program commands respectively for the different word lines in the SB0s and SB1s. For example, when writing data to the third word line of a metablock (e.g. WL 2), the controller may construct two program commands, one for the third word line of the SB0s in that metablock (e.g., WL 2), and one for the third word line of the SB1s in that metablock (e.g., WL 50). Thus, the controller may program the cells on the WL 2s in SB0s, followed by the cells on the third word lines (WL 50) in SB1s, when writing data to the metablock. Accordingly, NAND write operations on metablocks including SB0s and SB1s may be accomplished with minimal changes to controller metablock write handling.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
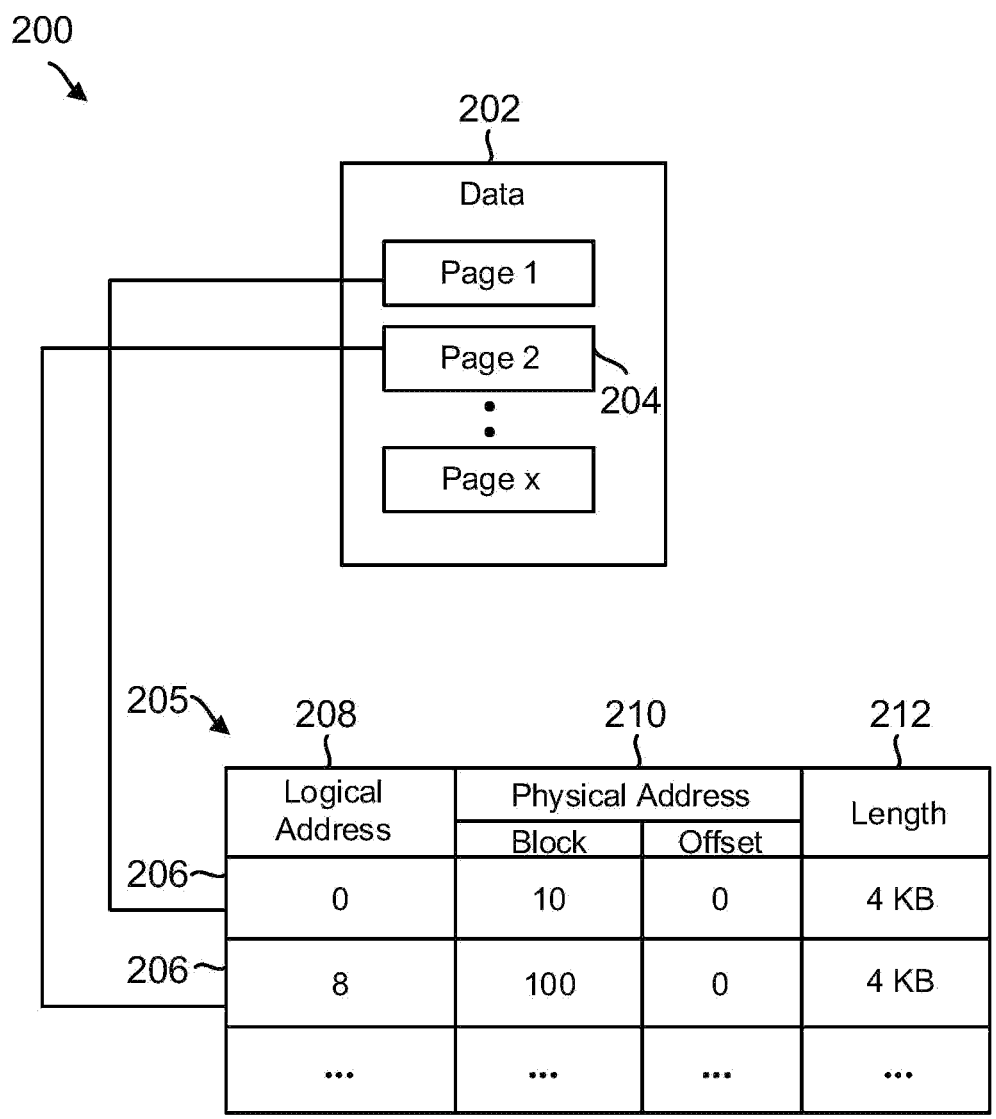
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
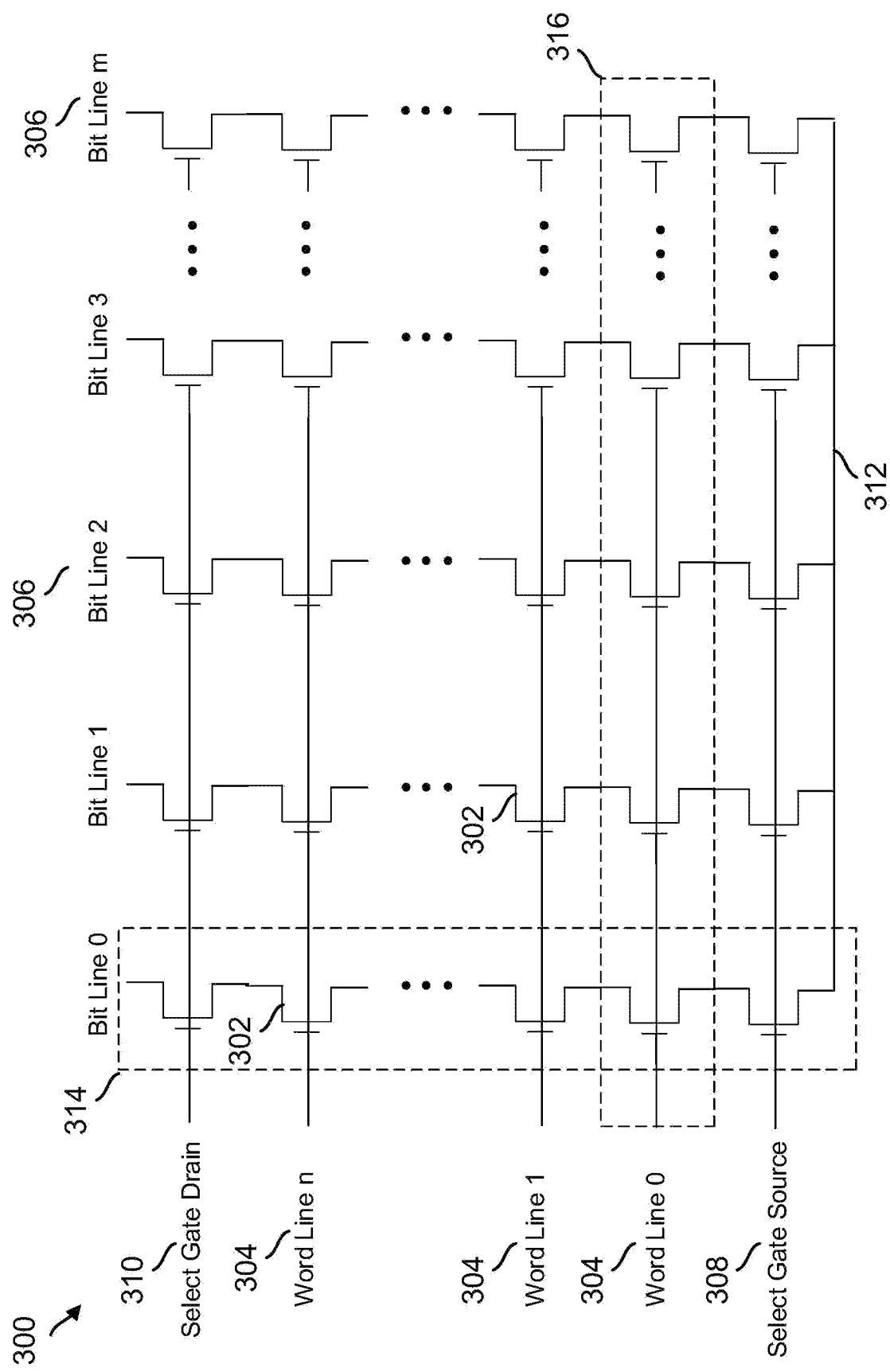
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
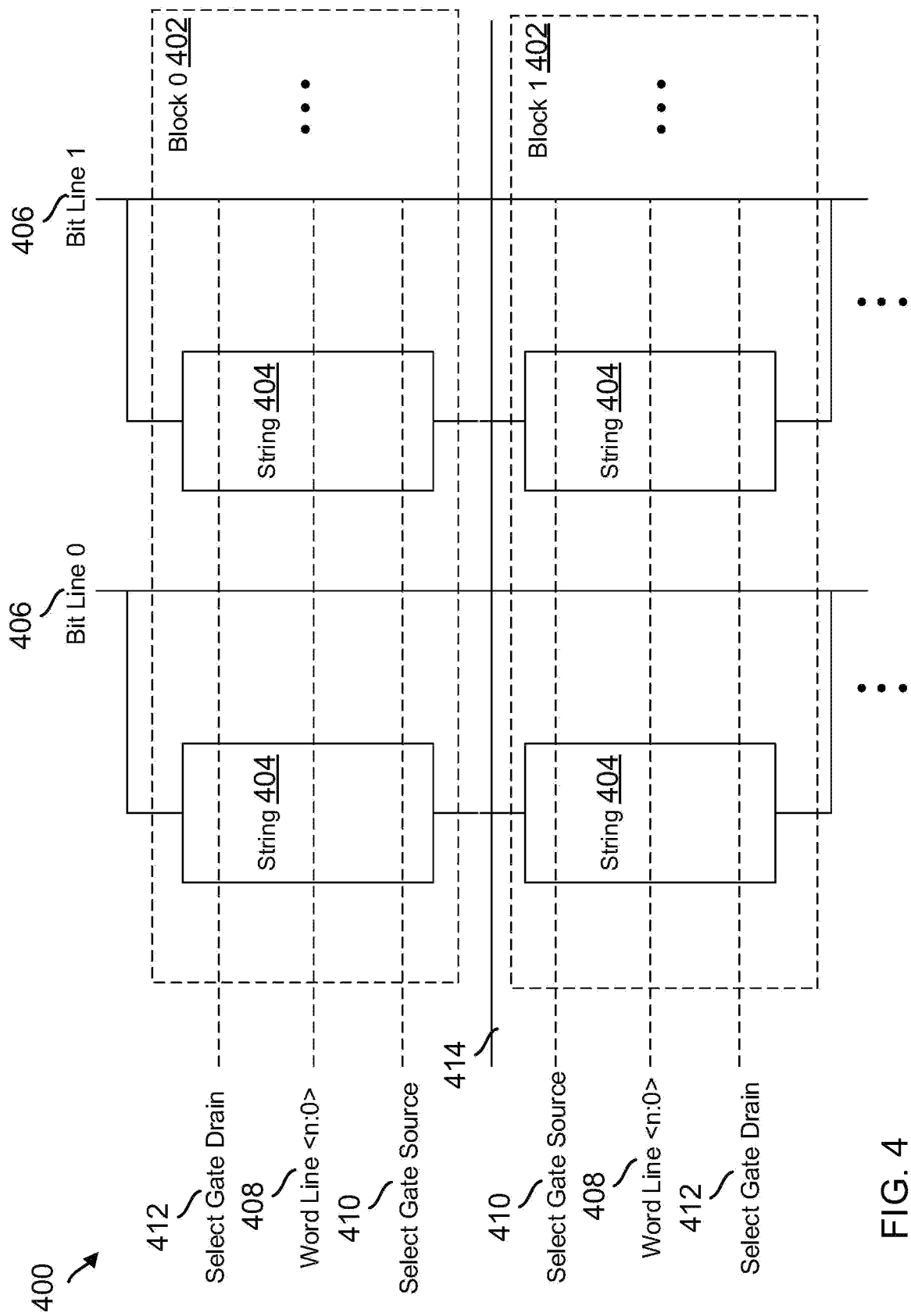
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
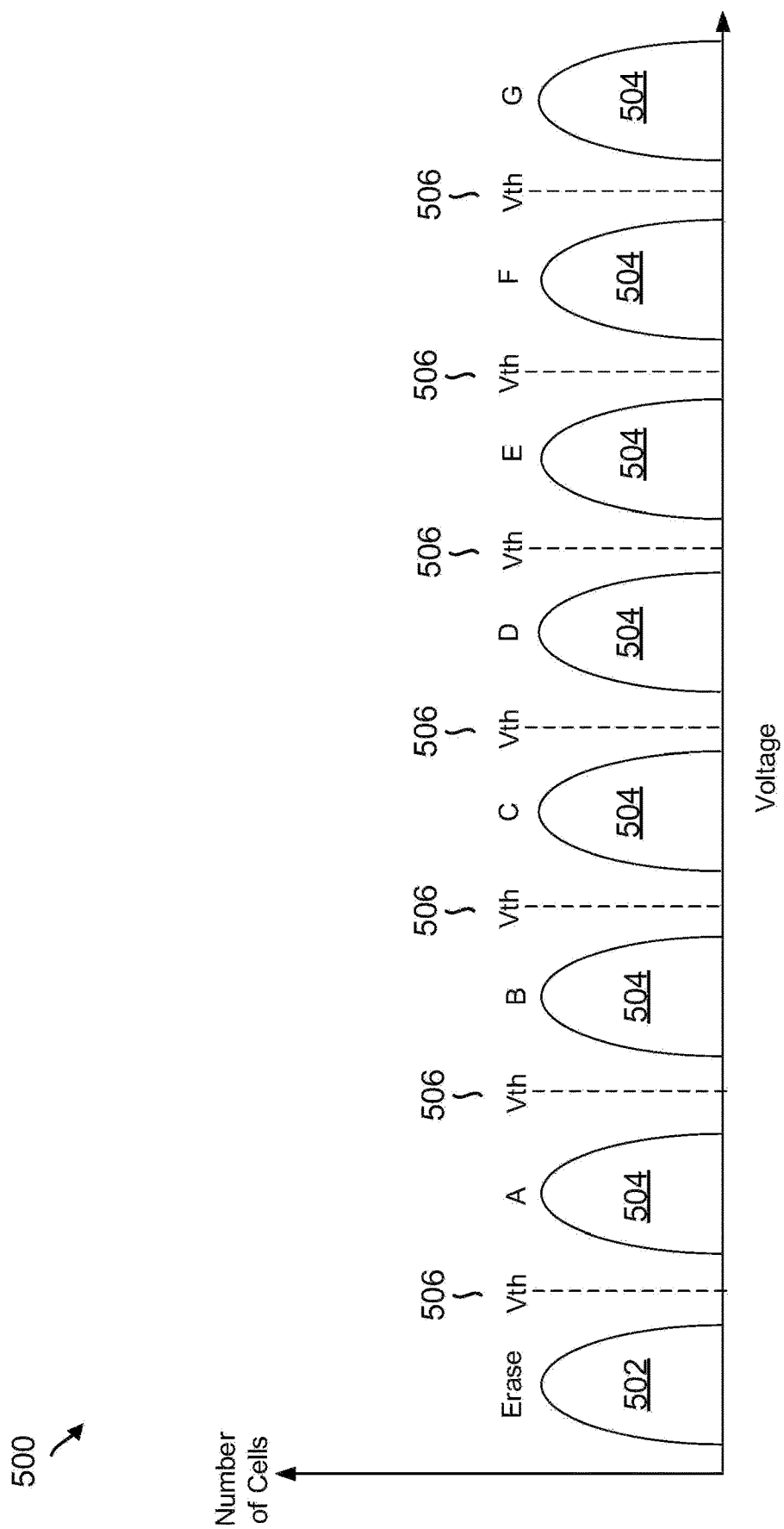
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

When the controller 123 attempts to program cells 116, 302 of a selected word line 304, 408 into one of the program states 504, the controller may perform incremental step pulse programming (ISPP) over a number of programming loops or ISPP cycles. For example, a programming voltage (e.g. a high voltage) may be applied to the selected word line 304, 408, a pass through voltage (e.g. a high voltage lower than the programming voltage) may be applied to the other word lines 304, 408, a bit line program voltage (e.g. a low voltage) may be applied on the bit lines 306, 406 connected to the selected cells being programmed on the selected word line, and a bit line inhibit voltage (e.g. a high voltage) may be applied on the bit lines 306, 406 connected to the other cells not being programmed on the selected word line. Applying a high programming voltage to the selected word line and a low voltage to the selected bit lines allows electrons to tunnel from the channel into the charge trapping layer of those selected cells, thereby causing the threshold voltage of the cells to increase. On the other hand, applying a high voltage to unselected bit lines inhibits electrons from tunneling from the channel into the charge trapping layer of those unselected cells, thereby preventing the threshold voltage of those cells from increasing. Thus, bit lines coupled to cells programmed to lower states may be inhibited to prevent the threshold voltage of those cells from increasing while other cells are programmed to higher states. For instance, in the case of TLCs, the bit lines of cells that are first programmed into the A state may be inhibited first, followed by the bit lines of different cells that are programmed into the B state, followed by those that reach the C state, then the D state, and so forth until the remaining cells on the selected word line ultimately reach the G state and all cells on the selected word line have been programmed.

After the programming voltage is applied in one programming loop or ISPP cycle, a program verify voltage (e.g. a low voltage) may be applied to the word line 304, 408 to determine whether the threshold voltage of a cell has increased beyond a respective threshold voltage into an intended program state. If none of the cells have transitioned into an intended programming state, then another programming loop or ISPP cycle is performed in which a higher programming voltage may be applied to further increase the threshold voltage of the cells. Subsequently, a program verify voltage may again be applied to determine whether the threshold voltage of a cell has transitioned into an intended program state. The above process of incrementally increasing the programming voltage and verifying the voltage threshold of the selected cells may be repeated over a number of programming loops. If the cells transition into their respective programming states and the total number of programming loops does not exceed a predetermined loop count, the controller may determine that the cells have entered their intended program states and are thus successfully programmed. Otherwise, if the total number of programming loops exceeds the predetermined loop count before the cells transition into their respective programming states, the controller may determine that a program failure has occurred.

Figure 6:
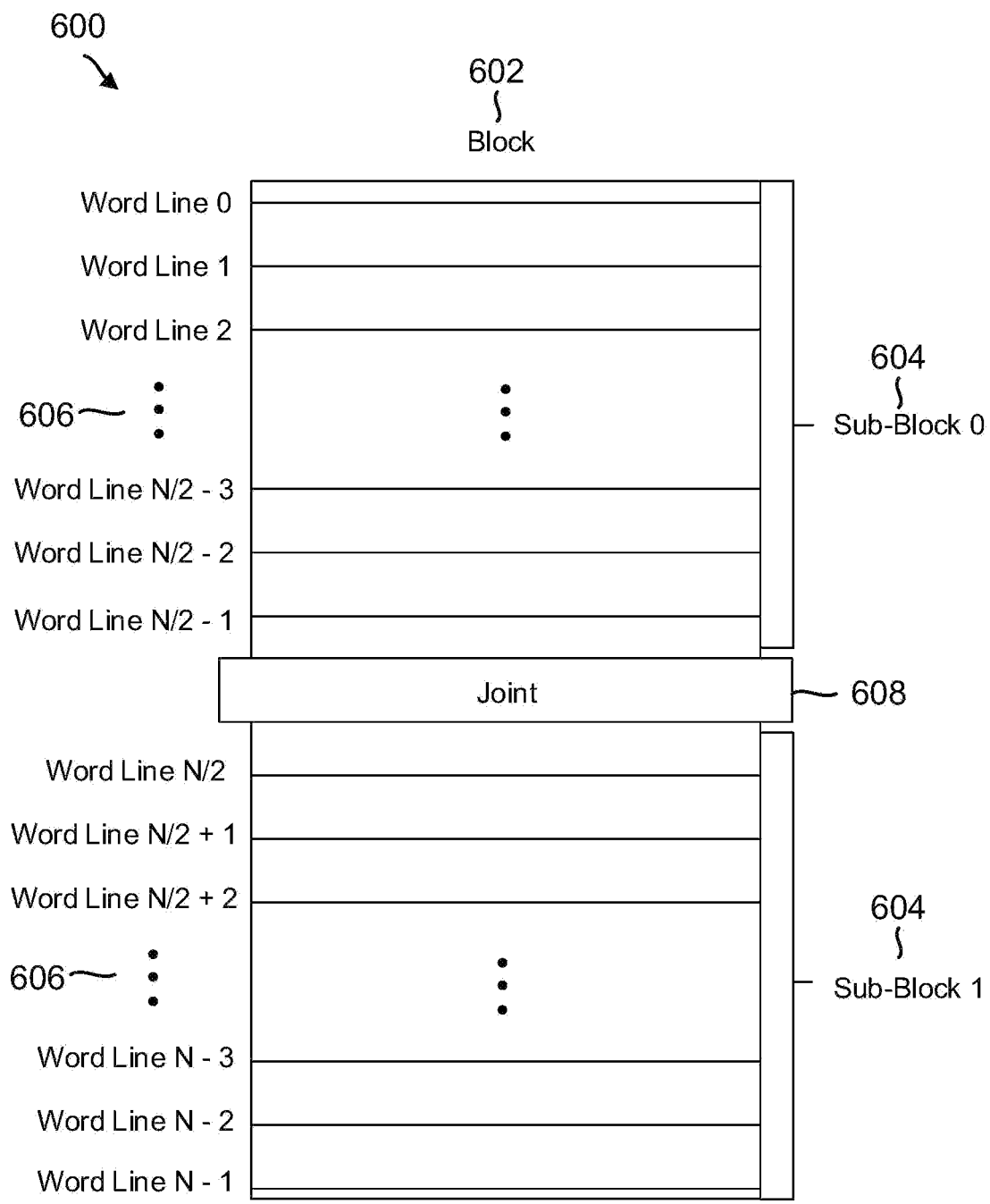
FIG. 6 is a conceptual diagram illustrating an example of sub-blocks in a block of the storage device of FIG. 1.

FIG. 6 illustrates an example 600 of a block 602 of cells which are divided into sub-blocks 604, where each sub-block 604 includes word lines 606. Block 602 may correspond to block 402 of FIG. 4, and word lines 606 may correspond to word lines 304, 408 of FIGS. 3 and 4. Sub-blocks 604 may be separated by a memory hole joint 608. As illustrated in FIG. 6, block 602 may include N WLs divided into two sub-blocks each including N/2 WLs, where a first one of the sub-blocks include WLs [0 to (N/2)−1], and a second one of the sub-blocks include WLs [(N/2) to N−1]. For instance, block 602 may be a 3-D NAND block with N=96 WLs having a memory hole joint separating the block into two sub-blocks, where one sub-block (with address SB0) includes WLs 0-47 and another sub-block (with address SB1) includes WLs 48-95. In other examples, block 602 may include a different number of WLs than 96 WLs, and thus sub-blocks 604 may each include a different number of WLs than 48 WLs. In further examples (e.g., in blocks with more than 96 WLs), block 602 may be divided into more than two sub-blocks. Moreover, each sub-block 604 may be independently readable, programmable, or erasable. For example, word lines 606 in SB0 and SB1 may be coupled to different row decoders or other circuitry allowing different read, program, or erase voltages to be applied to the cells in different sub-blocks.

The controller 123 may read, write, or erase data in sub-blocks 604 when operating in a sub-block mode (SBM). For example, when the controller 123 is operating in a SBM, the controller may read or write data in a page 316 of cells 302 coupled to a word line 304, 408, 606 of one of the sub-blocks 604 independently of the other sub-block(s) 604. For instance, when reading or programming a word line in a sub-block, the controller may send a command to apply a read voltage or program voltage to the selected word line of a particular sub-block and a pass through voltage to the other word lines in that sub-block, while applying other voltages (e.g., other than read/program or pass through voltages) to the word lines in the other sub-block. Similarly, if the controller erases data in a selected sub-block, the controller may apply an erase voltage to the word lines or substrate of that selected sub-block, while applying other voltages to the word lines or substrate of the other sub-block(s).

The controller 123 may logically link blocks (e.g., blocks 402, 602) or sub-blocks (e.g., sub-blocks 604) to form metablocks. A metablock is a logical grouping of blocks or sub-blocks. Each metablock may be indicated by a single logical address (e.g., a metablock address), which is mapped to one or more physical addresses (e.g., physical address 210) of the blocks or sub-blocks. For example, a metablock including multiple sub-blocks 604 may be associated with a metablock address that is mapped to the physical addresses 210 of each sub-block in the NVM 110. When the controller reads or writes data to a metablock, the controller translates the metablock address to the physical addresses 210 of the blocks 602 or sub-blocks 604 associated with the metablock, and the controller senses or programs data in the cells of those blocks or sub-blocks at the identified physical addresses as described above. Moreover, since the blocks or sub-blocks of the metablock may each be within a different plane, the controller may read or write data to multiple blocks or sub-blocks in parallel across the different planes.

Figure 7:
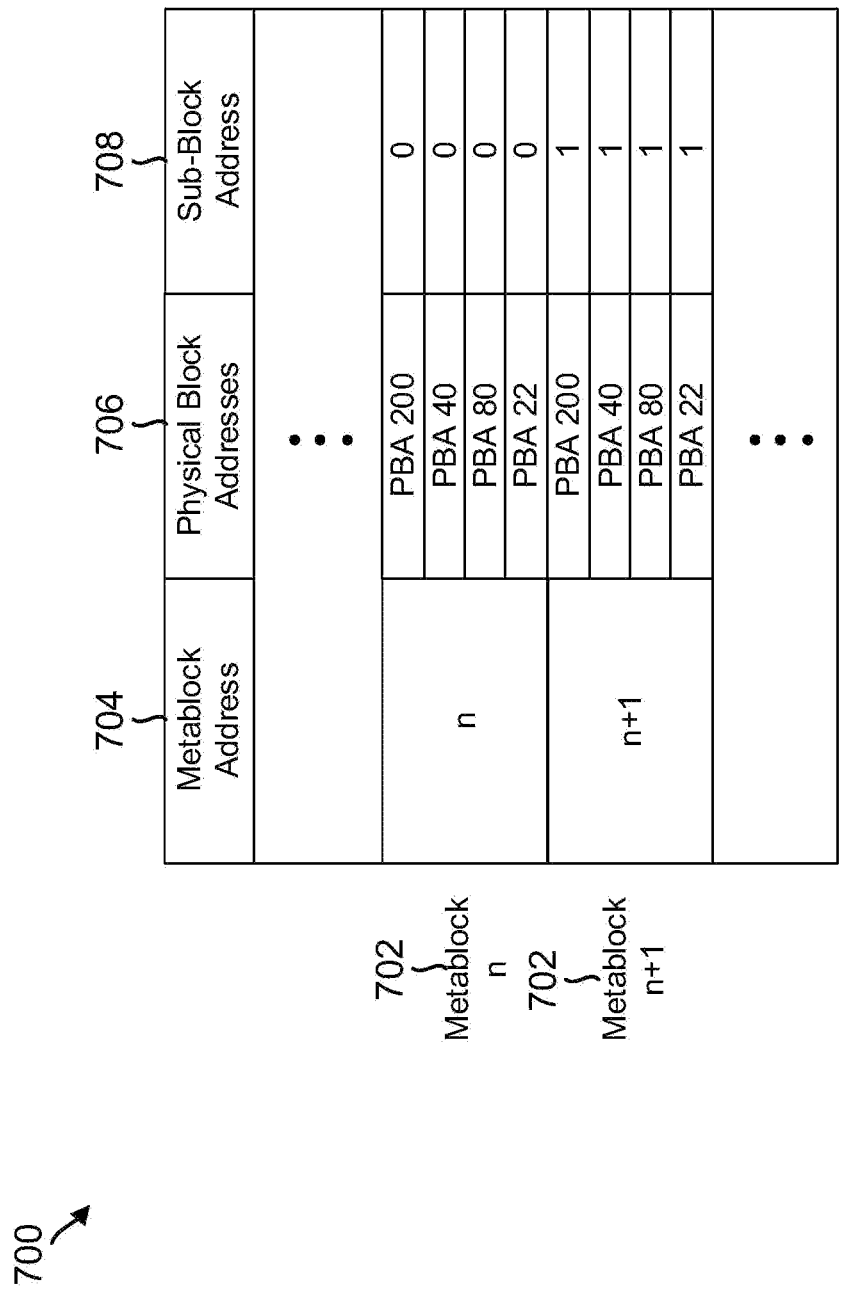
FIG. 7 is a conceptual diagram illustrating an example of a metablock mapping table in the storage device of FIG. 1.

FIG. 7 illustrates an example mapping 700 of metablocks 702, each associated with a metablock address 704, to physical block addresses 706 and sub-block addresses 708. Physical block addresses 706 may correspond, for example, to physical addresses 210 in FIG. 2. Sub-block addresses 708 may correspond to SB0 or SB1 (e.g., sub-blocks 604), although the number of sub-blocks in a block (and thus sub-block addresses) may be more than two in other examples. In the example of FIG. 7, the controller has formed various metablocks, including metablocks n and n+1, which may be mapped to the physical addresses of different sub-blocks across different planes (of different dies). In the illustrated example, each metablock may be a logical grouping of different sub-blocks associated with the same sub-block address. For instance, metablock n may include the first sub-block at PBA 200 in a first plane of a first die, the first sub-block at PBA 40 in a second plane of the first die, the first sub-block at PBA 80 in a first plane of a second die, and the first sub-block at PBA 22 in a second plane of the second die. Similarly, metablock n+1 may include the second sub-block at PBA 200 in the first plane of the first die, the second sub-block at PBA 40 in the second plane of the first die, the second sub-block at PBA 0 in the first plane of the second die, and the second sub-block at PBA 22 in the second plane of the second die. These addresses are merely examples; the metablocks may include blocks or sub-blocks having different addresses in other examples.

Figure 8:
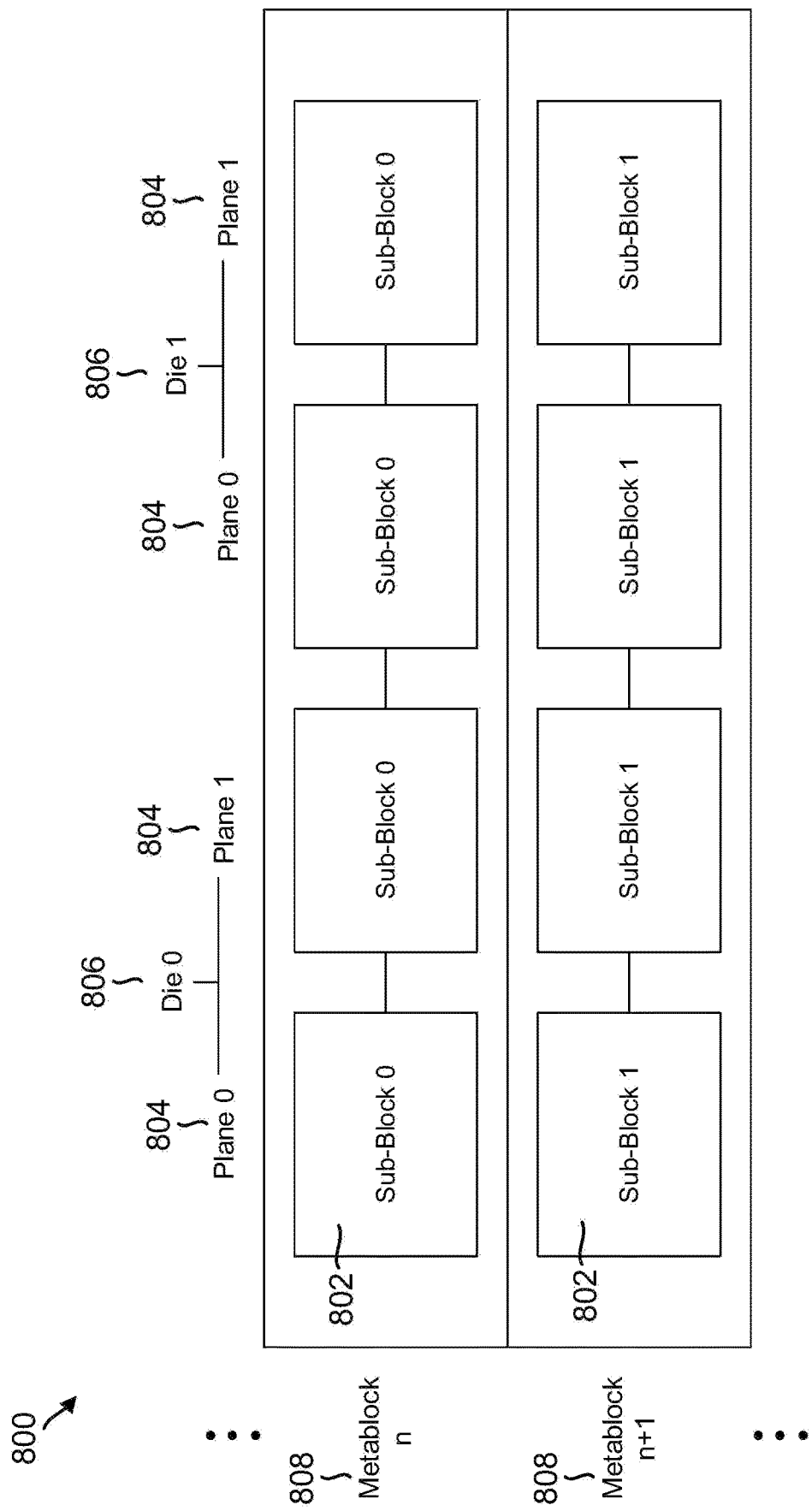
FIG. 8 is a conceptual diagram illustrating an example of sub-blocks with the same sub-block addresses across planes which are logically linked to form metablocks in the storage device of FIG. 1.

FIG. 8 illustrates an example 800 of sub-blocks 802 with same sub-block addresses (e.g., SB0 or SB1) logically linked across planes 804 of dies 806 to form metablocks 808. Sub-blocks 802 may correspond to sub-blocks 604 of FIG. 6, dies 806 may correspond to dies 114 of FIG. 1, and metablocks 808 may correspond to metablocks 702 of FIG. 7. For instance, metablock n may correspond to metablock n in FIG. 7 including sub-blocks 802 sharing sub-block address 0 (SB0), while metablock n+1 may correspond to metablock n+1 in FIG. 7 including sub-blocks 802 sharing sub-block address 1 (SB1). Thus, each plane's SB0 and SB1 may be part of the same block as illustrated in the example metablock mapping of FIG. 7. Alternatively, each plane's SB0 and SB1 may be part of different blocks. By linking sub-blocks 802 sharing same sub-block addresses into metablocks 808, the controller 123 may issue a single command to program cells in a metablock on the same word line. For instance, when performing a NAND write operation, if the controller 123 issues a command to program cells on the third word line of each sub-block 802 in metablock n (SB0), the controller may apply program voltages to WL 2 in each sub-block 802, while if the controller 123 issues a command to program cells on the third word line of each sub-block 802 in metablock n+1 (SB1), the controller may apply program voltages to WL 50 in each sub-block 802. Moreover, as each sub-block in a metablock occupies a different plane, the controller may program the entire metablock in parallel when executing a single write command.

Generally, the controller links sub-blocks 802 which share the same sub-block address (e.g., sub-block address 708) into the same metablock. For example, the controller may form metablocks 808 including only SB0s or only SB1s, but not metablocks including both SB0s and SB1s. As a result, if a metablock un-forms in response to an identified error in one of its sub-blocks (the sub-block is a bad sub-block), the controller may not be able to relink the remaining sub-blocks to form a new metablock. For example, if sub-block 802 in die 0, plane 1 of metablock n becomes a bad sub-block (e.g., a bad SB0), the controller may not be able to re-form a new metablock with the remaining, operable SB0s if a spare SB0 in that die and plane is unavailable. Thus, metablock n may remain un-formed, impacting die yield and reducing memory capacity.

Figure 9:
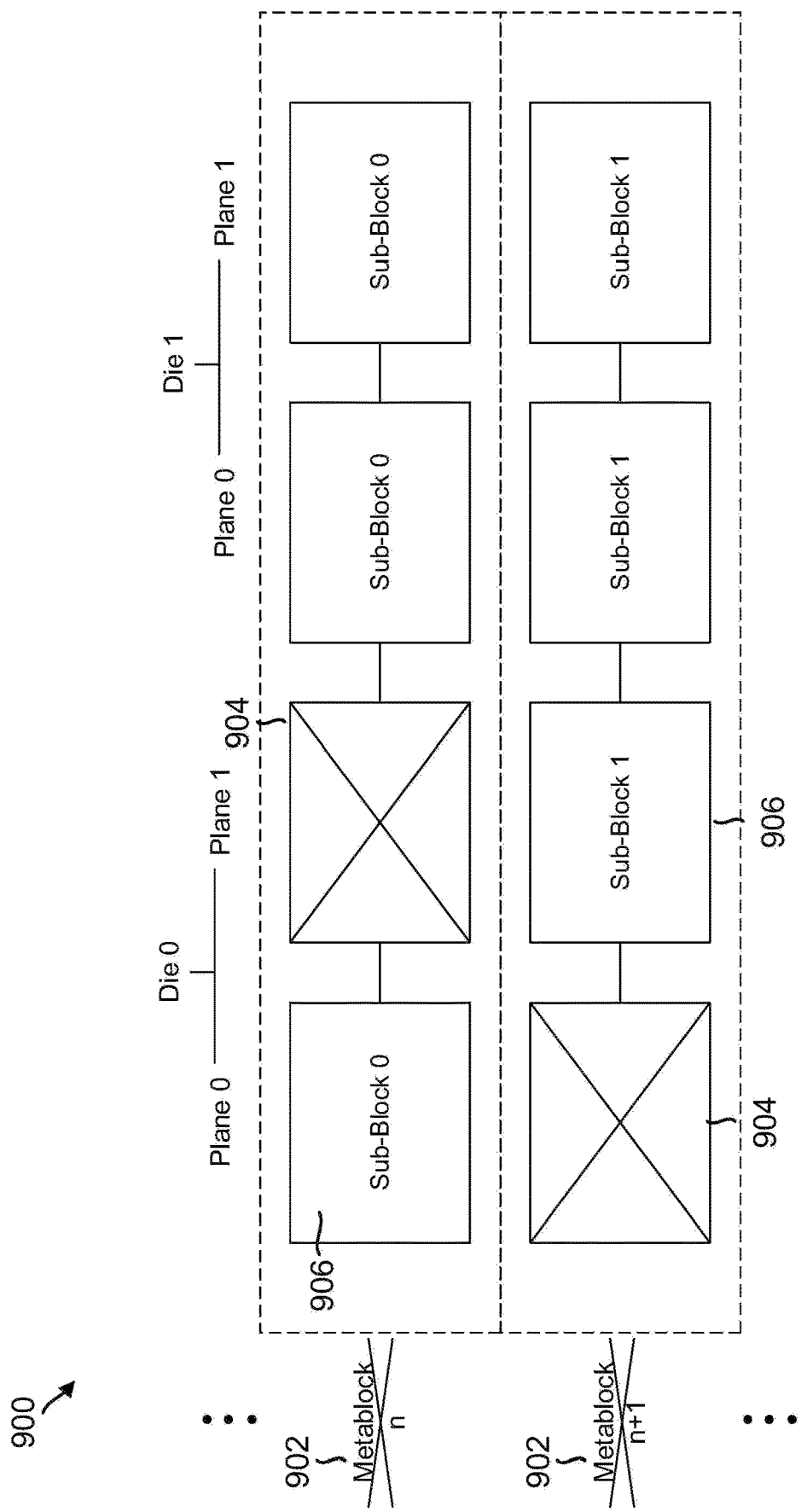
FIG. 9 is a conceptual diagram illustrating an example of un-formed metablocks in response to identification of bad sub-blocks in the storage device of FIG. 1.

FIG. 9 illustrates an example 900 of metablocks 902 (e.g., metablocks 808) which the controller may un-form in response to bad sub-blocks 904. For example, FIG. 9 illustrates the example where metablock n is un-formed in response to an error (e.g., a flipped bit count or a number of program failures exceeding a threshold) in SB0 in plane 1 of die 0, and where metablock n+1 is similarly un-formed in response to an error in SB1 in plane 0 of die 0. Moreover, the controller may not re-link any of the remaining sub-blocks 906 in metablock n+1 (e.g., error-free SB1s) together with any of the remaining sub-blocks in metablock n (e.g., error-free SB0s) to form a new metablock, since the resulting new metablock would include sub-blocks with different sub-block addresses (SB0 and SB1). Thus, if plane 0 or plane 1 of die 0 has a large number of bad sub-blocks, the controller may not be able to form new metablocks with the sub-blocks in that die. As a result, the die yield and memory capacity of the storage device may effectively reduce and possibly lead to the storage device entering a RO mode.

To prevent such impact to die yield and memory capacity, the controller 123 may link sub-blocks 802, 906 with different sub-block addresses 708 across multiple planes 804 of one or more dies 114, 806 to form metablocks 702, 808. For instance, if one metablock having only SB0s across planes 804 and another metablock having only SB1s across planes 804 are both un-formed due to bad sub-blocks 904, the controller may link the SB0s and SB1s together to form a new metablock. In this way, the controller may reclaim the metablocks 902 which otherwise may have been lost in response to bad sub-blocks 904. Such metablocks may be reclaimed from sub-blocks in different planes of a single die or across multiple dies.

Figure 10:
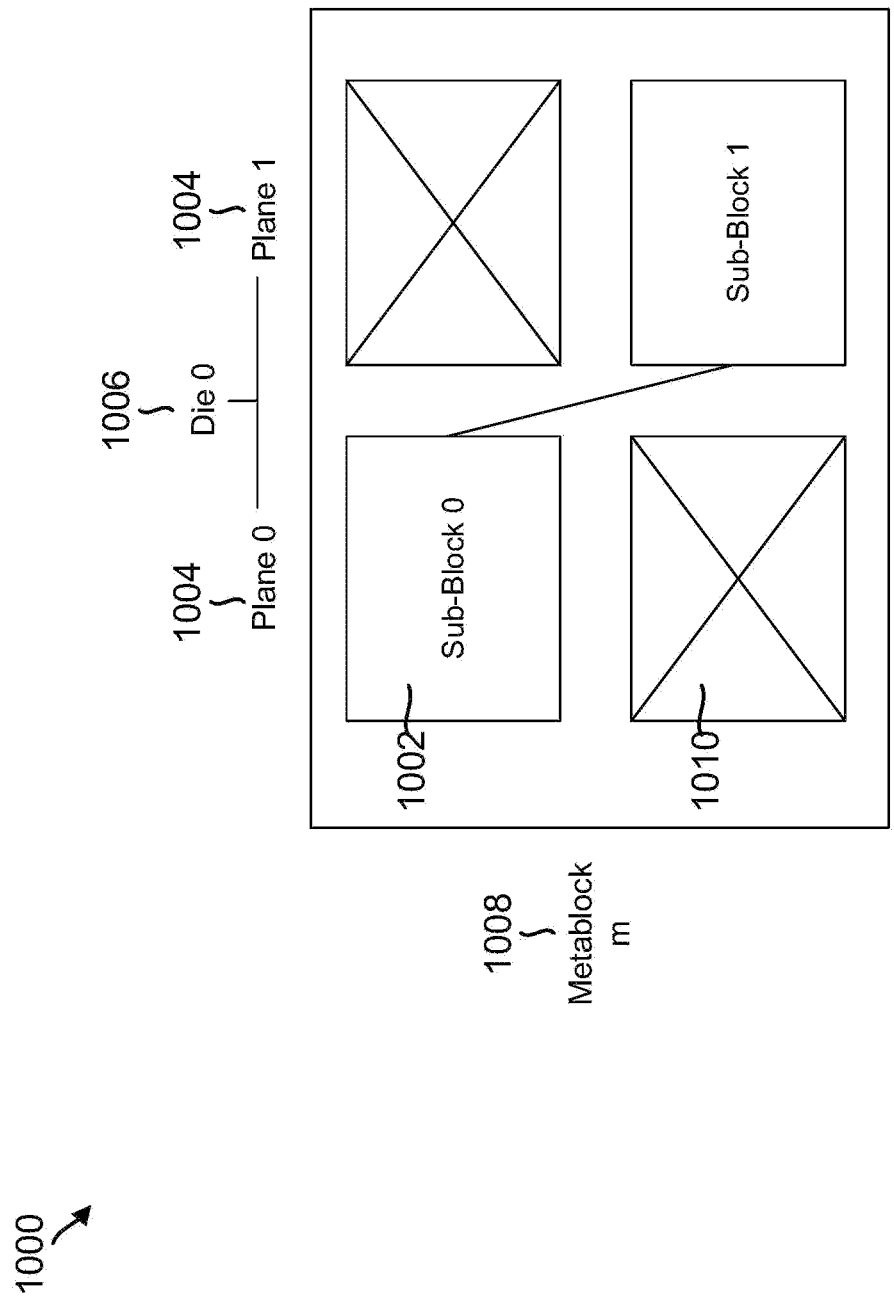
FIG. 10 is a conceptual diagram illustrating an example of sub-blocks with different sub-block addresses across planes of a single die which are logically relinked to form a metablock in the storage device of FIG. 1.

FIG. 10 illustrates an example 1000 of sub-blocks 1002 with different sub-block addresses that are logically linked across planes 1004 of a die 1006 to form a metablock 1008. In response to identifying bad sub-blocks 1010 having different sub-block addresses in each of the planes 1004, the controller 123 may form a new metablock with the remaining sub-blocks. For example, as illustrated in the single die example of FIG. 10, if the controller 123 identifies an error (e.g., a flipped bit count or a number of program failures exceeding a threshold) in a SB1 of plane 0 and in a SB0 of plane 1, the controller may relink SB0 in plane 0 with SB1 in plane 1 to form new metablock m. Thus, the controller may reclaim metablock m from the loss of metablocks n and n+1. Moreover, each sub-block 1002 and bad sub-block 1010 within a single plane may be part of the same block (e.g., SB0 and SB1 of plane 0 may be part of one block) or part of different blocks (e.g., SB0 of plane 0 may be part of one block and SB1 of plane 0 may be part of another block).

Figure 11:
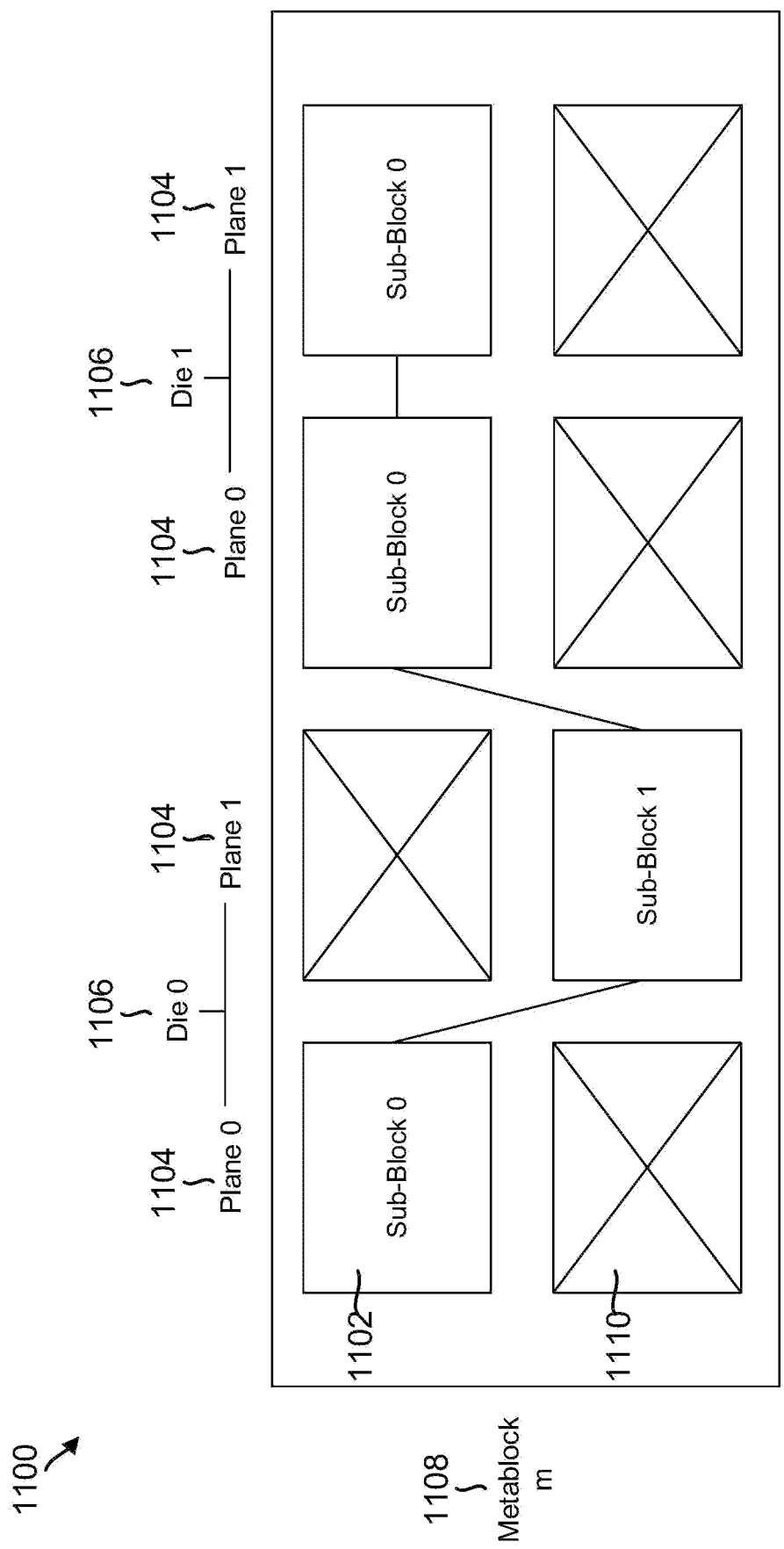
FIG. 11 is a conceptual diagram illustrating an example of sub-blocks with different sub-block addresses across planes of multiple dies which are logically relinked to form a metablock in the storage device of FIG. 1.

Similarly, FIG. 11 illustrates an example 1100 of sub-blocks 1102 with different sub-block addresses that are logically linked across planes 1104 of dies 1106 to form a metablock 1108. While the example of FIG. 11 illustrates reclaiming of metablocks in two dies, metablocks may similarly be reclaimed with any number of dies. In response to identifying bad sub-blocks 1110 having different sub-block addresses in each of the planes 1104, the controller 123 may form a new metablock with the remaining sub-blocks. For example, as illustrated in the multiple die example of FIG. 11, the controller may relink SB0 in plane 0 of die 0, SB1 in plane 1 of die 0, SB0 in plane 0 of die 1, and SB0 in plane 1 of die 1 to form new metablock m. Moreover, each sub-block 1102 and bad sub-block 1110 within a single plane may be part of the same block (e.g., SB0 and SB1 of plane 0, die 0 may be part of one block) or part of different blocks (e.g., SB0 of plane 0, die 0 may be part of one block and SB1 of plane 0, die 0 may be part of another block).

Additionally, when the controller 123 performs a write operation on a metablock with different sub-block addresses (e.g., metablock 1008, 1108 including SB0s and SB1s), the controller may issue multiple program commands corresponding to the different word lines in the SB0s and SB1s. For instance, when the controller writes data to the cells on the third word line in metablock 1008, 1108 across planes 1004, 1104, the controller may employ a two-stage programming sequence in which the controller may first program the cells on the third word line in the SB0s (WL2), and then program the cells on the third word line in the SB1s (WL50). The controller may program the cells on each of these word lines at a die page level, where the same word line is selected in multiple planes within a die and the length of the data programmed corresponds to the die's physical page size (e.g., 32 KB), or the controller may program the cells on each of these word lines at a partial page level, where the word line is individually selected in each plane within a die and the length of the data programmed is less than the die's physical page size (e.g., 16 KB). The controller may operate similarly when writing data to cells on any word line in a metablock. Thus, NAND write operations on metablocks including different sub-block addresses may be accomplished with minimal changes to controller metablock write handling.

Figure 12:
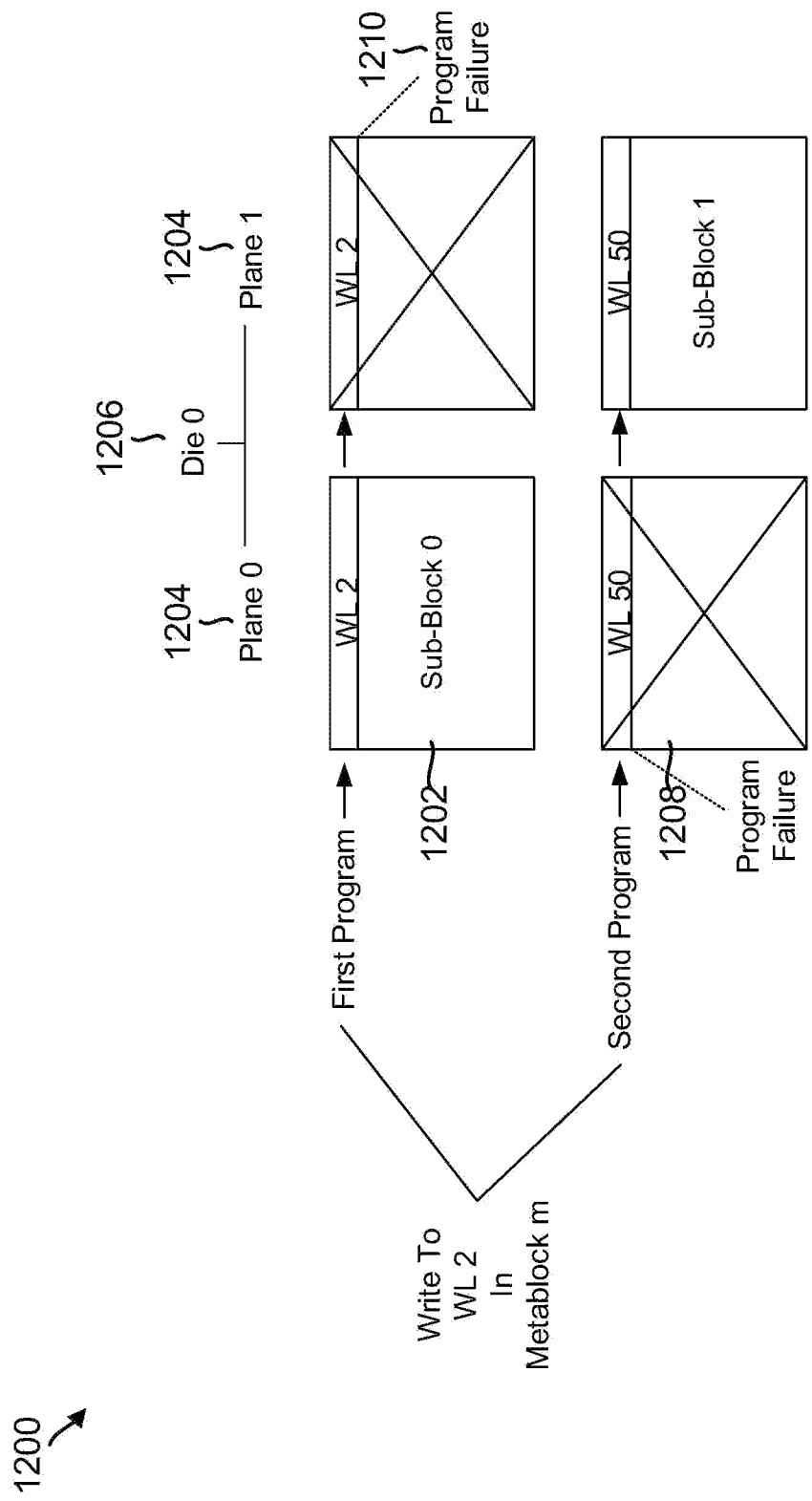
FIG. 12 is a conceptual diagram illustrating an example of a two-stage programming sequence for a metablock including sub-blocks with different sub-block addresses in the storage device of FIG. 1.

FIG. 12 illustrates an example 1200 of a two-stage programming sequence which the controller 123 may perform when writing data to a word line in metablock m (e.g., metablock 1008 of FIG. 10). While FIG. 12 illustrates the example where the controller performs full die page programming (e.g., at a die page level), in other examples the controller may perform partial page programming (e.g., at a partial page level). In this example, the controller 123 executes a write command to write data to cells coupled to the third word line (WL 2) of metablock m, although the controller may select another word line in other examples. During execution of the write command, the controller first programs the cells on the third word line in sub-blocks 1202 (SB0s) across planes 1204 of one or more dies 1206, irrespective of whether the SB0s are bad sub-blocks 1208. For example, the controller may apply a program voltage to the third word line of SB0 (WL 2) in plane 0 and to the third word line of SB0 (WL 2) in plane 1, even though SB0 in plane 1 is a bad sub-block. As a result, a program failure 1210 may occur in response to the attempt to program the cells in the bad sub-block. For instance, a program failure may arise in the bad sub-block in response to a number of attempts or loops to program the cells exceeding a threshold loop count, or in response to some other programming error in the sub-block. Nevertheless, as the controller may determine that the program failure 1210 arose in a bad sub-block, the controller may disregard the error. Instead, the controller may continue to program the cells on the third word line in the other sub-blocks (SB1s) across the planes 1204 of the one or more dies 1206, similarly without regard to whether the sub-blocks are bad-sub blocks. For example, the controller may apply a program voltage to the third word line of SB1 (WL 50) in plane 0 and to the third word line of SB1 (WL 50) in plane 1, even though SB1 in plane 0 is a bad sub-block. The controller may similarly disregard any program failures that may arise in the bad sub-block of plane 0. Thus, the controller may perform two corresponding program operations during execution of a single write command when writing data to a metablock including SB0s and SB1s.

Accordingly, the controller 123 may reclaim metablocks that otherwise may have been lost due to bad sub-blocks by linking sub-blocks with different sub-block addresses (SB0s and SB1s) across planes of one or more dies to form new metablocks. The controller may perform such linking of metablocks in response to identifying bad sub-blocks having different sub-block addresses in different planes of the same die (e.g., a bad sub-block SB1 in plane 0 and a bad sub-block SB0 in plane 1, or vice-versa), since die yield or memory capacity may be reduced if metablocks were limited to sub-blocks having the same sub-block address. However, when a block in a plane does not have any bad sub-blocks (e.g., the full physical block is error-free), the controller may exclude the sub-blocks in that error-free block from being formed into individual metablocks. This approach allows the controller to store certain types of data, such as control information (e.g., boot data, error logging data, TLC data, etc.), more effectively since the error-free block is not separately mapped into individual sub-blocks. For instance, the controller may operate outside of the sub-block mode when storing data in error-free blocks.

Figure 13:
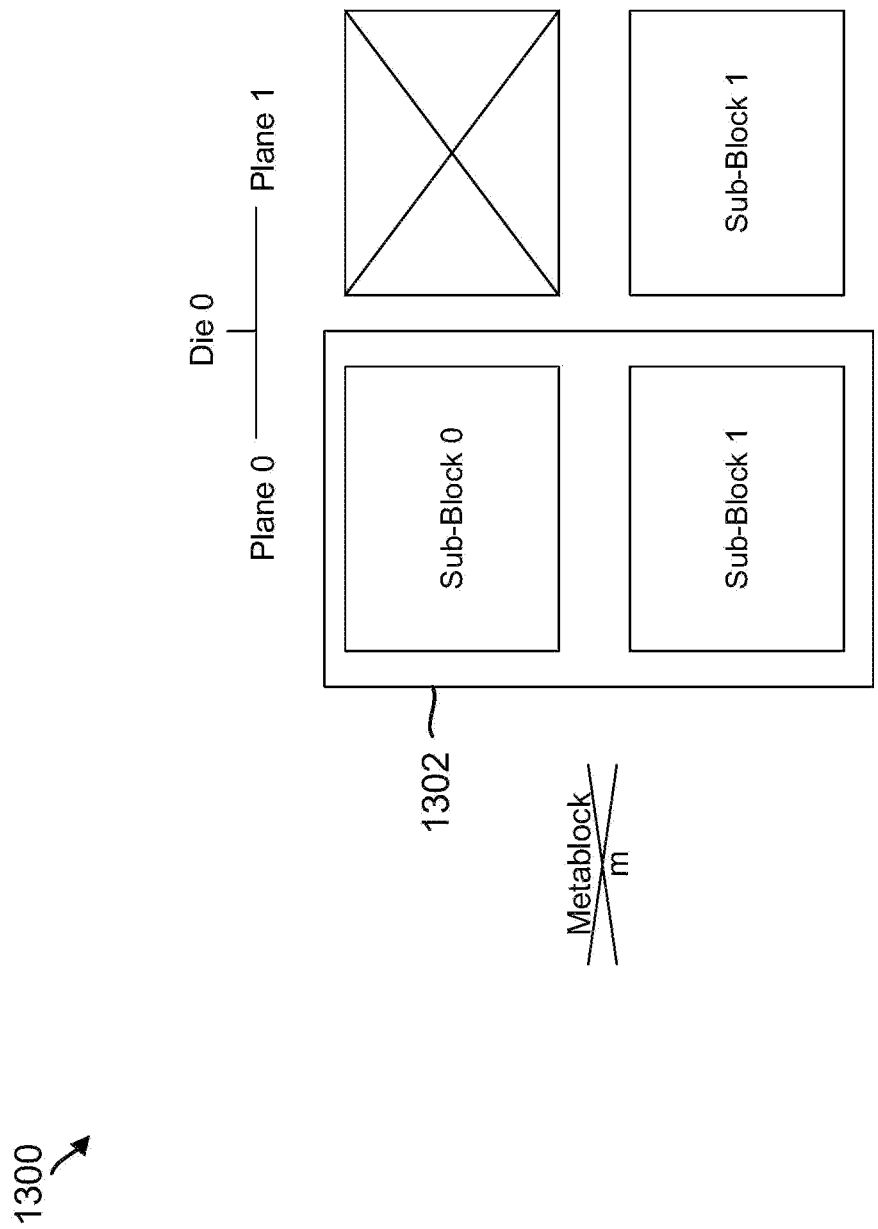
FIG. 13 is a conceptual diagram illustrating an example of a physical block which is excluded from metablock formation notwithstanding the existence of sub-blocks with different sub-block addresses in the storage device of FIG. 1.

FIG. 13 illustrates an example 1300 of a block 1302 including sub-blocks SB0 and SB1 in a same plane (e.g., plane 0), which the controller may exclude from being linked with sub-blocks of a different plane (e.g., plane 1) to form metablock m (e.g., metablock 1008). For instance, the controller may refrain from linking SB0 of plane 0 with SB1 of plane 1 to form metablock m, when the block 1302 including that SB0 does not include any bad sub-blocks as illustrated in FIG. 13. The controller may exclude the linking of sub-blocks in block 1302 with other sub-blocks since such linking would possibly prevent more efficient use of that block 1302 for non-sub-block related purposes. For example, the controller may instead allocate block 1302 to store control information since such information may be more effectively stored in a full block rather than in a sub-block. Alternatively, the controller may link block 1302 with other blocks to form a metablock (including blocks rather than sub-blocks), thus allowing for non-sub block mode usage of that metablock. If later on the controller identifies an error in SB1 of block 1302, then after that time the controller may relink its remaining SB0 to form a metablock (e.g. metablock 1008) as described above.

Figure 14:
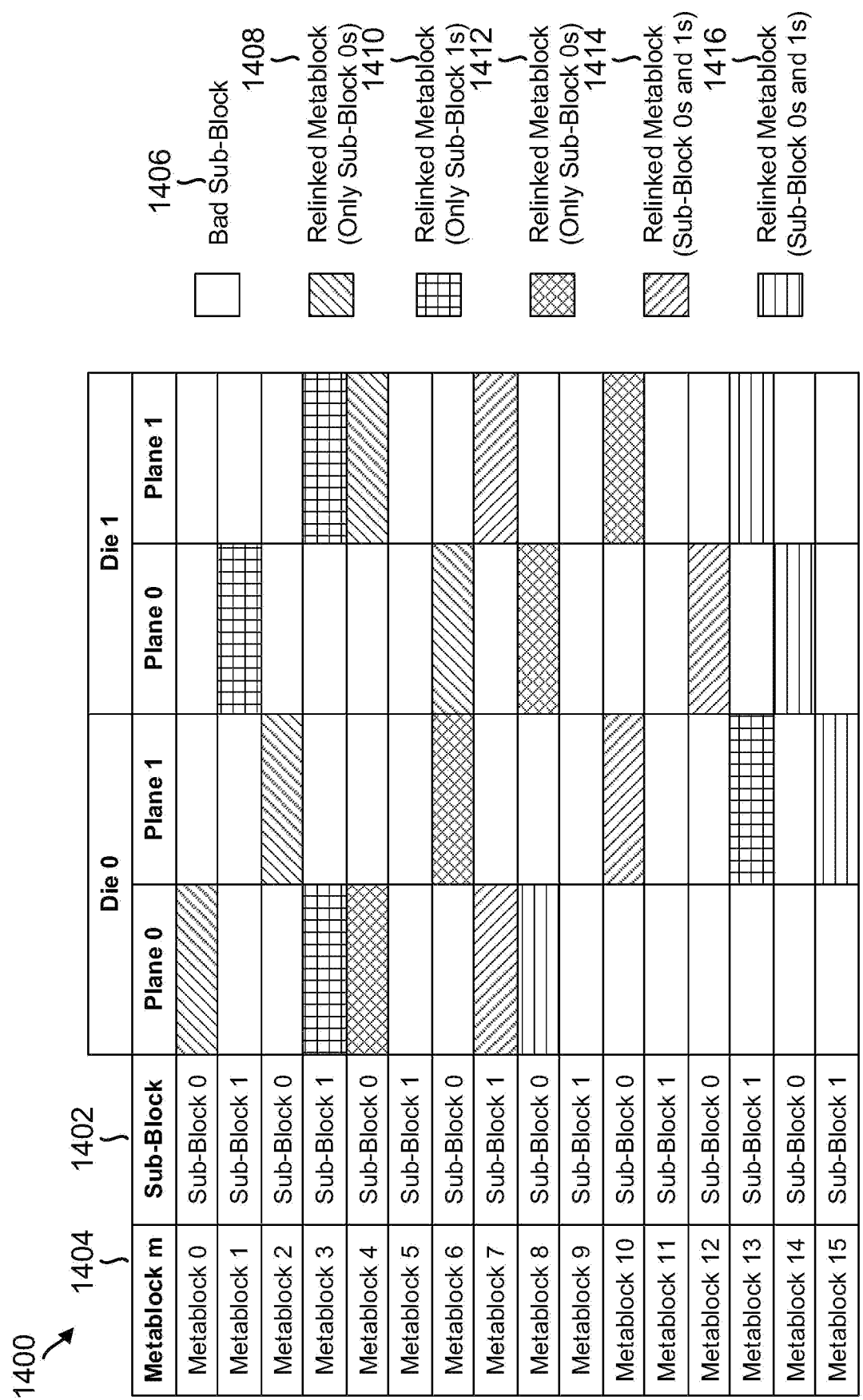
FIG. 14 is a conceptual diagram illustrating an example of multiple relinked metablocks including sub-blocks with same and different sub-block addresses in the storage device of FIG. 1.

FIG. 14 illustrates an example 1400 of sub-blocks 1402 in planes of multiple dies that are relinked to form metablocks 1404 as a result of bad sub-blocks 1406. The metablocks 1404 may include sub-blocks 1402 having same sub-block addresses (e.g., relinked metablock 1408, 1410, 1412) and sub-blocks 1402 having different sub-block addresses (e.g., relinked metablock 1414, 1416). In particular, FIG. 14 illustrates the example where sixteen metablocks were initially formed with sub-blocks associated with a same sub-block address, but later these metablocks were un-formed in response to bad sub-blocks 1406 and so the controller relinked the remaining operable sub-blocks to form new metablocks. In the illustrated example arrangement of bad sub-blocks, the controller has relinked sub-blocks having the same sub-block address to form three new metablocks (e.g., relinked metablock 1408, 1410, 1412), and the controller has relinked sub-blocks having different sub-block addresses to form two new metablocks (e.g., relinked metablock 1414, 1416).

Thus, the example of FIG. 14 illustrates the yield difference or capacity that may be recovered as a result of the controller forming metablocks with different sub-block addresses. In particular, while the controller may only recover approximately 18% of the failed metablocks (3 metablocks out of 16) when constrained to same sub-block addresses, the controller may recover approximately 31% of the failed metablocks (5 metablocks out of 16) when allowed to relink same and different sub-block addresses. By supporting recovery of more failed metablocks in this manner, the life of the storage device may effectively be extended. In other examples, different yield growths may be achieved based on the number of recoverable metablocks, which may vary from memory to memory.

FIG. 15 illustrates an example flow chart 1500 of a method for linking sub-blocks with different sub-block addresses to form metablocks and for writing data to a metablock using a two-stage programming sequence. For example, the method can be carried out in a storage device 102 such as the one illustrated in FIG. 1. Each of the steps in the flow chart can be controlled using the controller as described below (e.g. controller 123), by a component or module of the controller, or by some other suitable means.

As represented by block 1502, the controller may link a first sub-block in a first plane with a second sub-block in a second plane to form a metablock, where the first sub-block and second sub-block are associated with different sub-block addresses. The sub-blocks are part of blocks in different planes of memory. For example, referring to FIGS. 1, 4, 6, 7, and 10, the controller 123 may form metablock 1008 by linking a sub-block 604, 1002 of a block 402, 602 in one plane in memory (e.g., the NVM 110) with another sub-block 604, 1002 of another block 402, 602 in another plane in the memory. For instance, as illustrated in FIG. 10, the controller may link a SB0 in plane 0 of die 0 with a SB1 in plane 1 of die 0. The sub-blocks are associated with different sub-block addresses 708. For example, one of the sub-blocks 1002 may be SB0 (sub-block address 0) while the other of the sub-blocks 1002 may be SB1 (sub-block address 1). The controller may link the sub-blocks 1002 to form metablock 1008 by forming a logical group associating physical or logical addresses of the sub-blocks with a logical address associated with the metablock. For instance, the controller may link the sub-blocks to form a metablock as illustrated in the metablock mapping table of FIG. 7.

The first plane and the second plane may be in different dies. For instance, referring to FIG. 11, the controller may link a sub-block 1102 (e.g., SB1) in plane 1 of die 0 with another sub-block 1102 (e.g., SB0) in plane 0 of die 1 when forming metablock 1108.

Moreover, the memory may include additional blocks in additional planes, where each of the additional blocks has a plurality of additional sub-blocks, and the metablock further includes two or more of the additional sub-blocks. For instance, referring to FIGS. 4, 6, and 11, the controller may form a metablock 1108 using sub-blocks 1102 of blocks 402, 604 in separate planes of multiple dies, or in multiple planes of a same die. Thus, in comparison to the metablock 1008 of FIG. 10, the NVM 110 may include additional blocks (e.g., blocks 402, 602) in additional planes (e.g., plane 0 and plane 1 of die 1), where each of the additional blocks includes its own respective sub-blocks 604, and the metablock 1108 includes at least two of these additional sub-blocks. For example, FIG. 11 illustrates a metablock 1108 including four sub-blocks across four planes or two dies, in contrast to FIG. 10's metablock 1008 which includes two sub-blocks across two planes or one die. Thus, the metablock may be extended across any number of dies.

As represented by block 1504, the controller may form the metablock in response to identifying an error in a third sub-block in the first plane and in a fourth sub-block in a second plane. For example, referring to FIG. 10, the controller may form metablock 1008 (by linking first SB0 in plane 0 with second SB1 in plane 1) in response to identifying that third SB1 in plane 0 and fourth SB0 in plane 1 are bad sub-blocks 1010. For instance, the controller may identify a sub-block to be a bad sub-block 1010 in response to determining that a number of flipped bits or program failures in that sub-block exceeds a predetermined threshold.

As represented by block 1506, the controller may form the metablock in response to identifying an error in other metablocks respectively including the first sub-block and the second sub-block. For instance, referring to FIG. 14, the controller may form relinked metablocks 1414, 1416 in response to identifying a bad sub-block 1406 in the initial metablocks 1404 respectively including the sub-blocks 604, 1102, 1402. For instance, the controller may identify a sub-block to be a bad sub-block 1406 (and thus that an error exists in the initially formed metablocks) in response to determining that a number of flipped bits or program failures in a respective sub-block exceeds a predetermined threshold.

The metablock may exclude sub-blocks that are part of error-free blocks. For instance, referring to FIG. 13, the controller may refrain from forming metablocks with sub-blocks in block 1302 which do not include bad sub-blocks. Instead, the controller may store control information in block 1302, or form metablocks linking other blocks with the entire block 1302 (rather than individual sub-blocks of block 1302).

As represented by block 1508, the controller may write data to the metablock. For example, as represented by block 1510, the controller may program a word line in a first sub-block in one of the planes, and as represented by block 1512, the controller may subsequently program a different word line in a second sub-block in another one of the planes. For example, referring to FIG. 12, the controller may write data to a selected word line (e.g. WL 2) in metablock m (e.g., metablock 1008 or 1108) by first programming WL2 in SB0 of plane 0 and subsequently programming WL50 in SB1 of plane 1. The controller may program the cells on each word line, for example, at a die page level or partial page level using ISPP as described above.

Additionally, as represented by block 1514, the controller may program the different word line in the second sub-block following a program failure in a third sub-block. For example, referring to FIG. 12, when the controller first programs WL2 in SB0 of plane 0, the controller may also program WL2 in SB0 of plane 1 (e.g., in parallel). However, the controller may determine that a program failure 1210 occurs in SB0 of plane 1 since that sub-block is a bad sub-block 1208. For instance, the controller may determine that a threshold number of flipped bits or unsuccessful program loops exceeding a predetermined threshold have occurred in SB0 of plane 1. When such program failure arises, the controller may disregard the error and continue to subsequently program WL 50 in SB1 of plane 1 as previously described.

Figure 16:
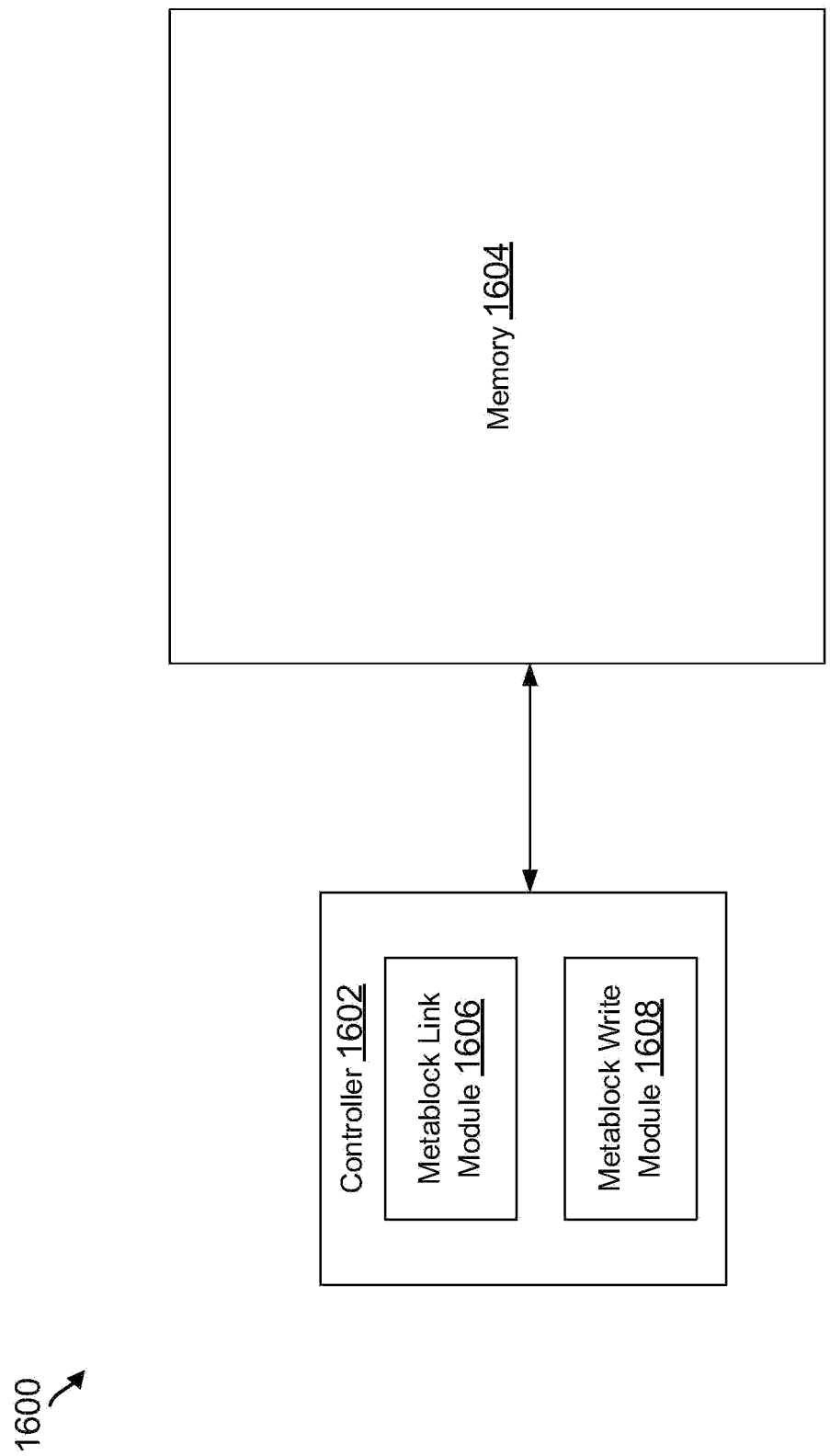
FIG. 16 is a conceptual diagram illustrating an example of a controller that links sub-blocks with different sub-block addresses to form metablocks and writes data to a metablock using a two-stage programming sequence in the storage device of FIG. 1.

FIG. 16 is a conceptual diagram illustrating an example 1600 of a controller 1602 coupled to a memory 1604 in a storage device. For example, controller 1602 may correspond to controller 123 and memory 1604 may correspond to the NVM 110 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

The controller 1602 may include a metablock link module 1606 that may provide a means for linking a first sub-block in a first plane with a second sub-block in a second plane to form a metablock, where the first sub-block and second sub-block are associated with different sub-block addresses. For example, the metablock link module 1606 may perform the aforementioned process described at 1502. In one configuration, the metablock link module may be further configured to form the metablock in response to identifying an error in a third sub-block in the first plane and in a fourth sub-block in a second plane, e.g., as described in connection with 1504. In one configuration, the metablock link module may be further configured to form the metablock in response to identifying an error in other metablocks respectively including the first sub-block and the second sub-block, e.g., as described in connection with 1506.

The controller 1602 may also include a metablock write module 1608 that may provide a means for programming a word line in a first sub-block in one of the planes and for programming a different word line in a second sub-block in another one of the planes, where the first sub-block and second sub-block are part of a metablock and include different sub-block addresses. For example, the metablock write module 1608 may perform the aforementioned process described at 1508. For instance, the metablock write module 1608 may be configured to program different word lines in the first and second sub-blocks when writing data to the metablock, e.g., as described in connection with 1510 and 1512. In one configuration, the metablock write module 1608 may be further configured to program the different word line in the second sub-block following a program failure in a third sub-block, e.g., as described in connection with 1514.

Accordingly, the controller described in the present disclosure improves die yield and memory capacity of the storage device by linking sub-blocks having different sub-block addresses across multiple planes to form metablocks. For instance, if one metablock having only SB0s across planes and another metablock having only SB1s across planes are both un-formed due to bad sub-blocks, the controller may link the SB0s and SB1s together to form a new metablock. In this way, the controller may reclaim metablocks that otherwise may have been lost due to bad sub-blocks. Moreover, the controller may issue program commands respectively for the different word lines in the SB0s and SB1s when writing data to such linked metablocks. For example, when executing a command to write data to cells coupled to a third word line in a metablock, the controller may program the cells on the WL 2s in SB0s, followed by the cells on the WL 50s in SB1s, in response to the single write command. Accordingly, NAND write operations on metablocks including SB0s and SB1s may be accomplished with minimal changes to controller metablock write handling.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory including a plurality of blocks in different planes, wherein each of the blocks includes a plurality of sub-blocks; and
a controller configured to link a first one of the sub-blocks in a first one of the planes with a second one of the sub-blocks in a second one of the planes to form a metablock, wherein the first one of the sub-blocks and the second one of the sub-blocks are associated with different sub-block addresses;
wherein the metablock is a logical grouping of the first one of the sub-blocks and the second one of the sub-blocks;
wherein the controller is further configured, during a write operation associated with the metablock, to program a first word line in the first one of the sub-blocks and to subsequently program a second word line in the second one of the sub-blocks following a program failure responsive to programming of the first word line.

2. The storage device of claim 1, wherein the controller is configured to form the metablock in response to identifying an error in a third one of the sub-blocks in the first one of the planes and in a fourth one of the sub-blocks in the second one of the planes.

3. The storage device of claim 1, wherein the controller is configured to form the metablock in response to identifying an error in other metablocks respectively including the first one of the sub-blocks and the second one of the sub-blocks.

4. The storage device of claim 1, wherein the first one of the planes is in a first die and the second one of the planes is in a second die.

5. The storage device of claim 1, wherein the memory further includes additional blocks in additional planes, each of the additional blocks having a plurality of additional sub-blocks, and the metablock further includes two or more of the additional sub-blocks.

6. The storage device of claim 1, wherein the metablock excludes the sub-blocks that are part of error-free blocks.

7. A storage device, comprising:
a memory including a plurality of blocks in different planes, wherein each of the blocks includes a plurality of sub-blocks; and
a controller configured to program a word line in a first one of the sub-blocks in one of the planes and to program a different word line in a second one of the sub-blocks in another one of the planes following a program failure responsive to programming of the word line, wherein the first one of the sub-blocks and the second one of the sub-blocks are parts of a metablock and include different sub-block addresses;
wherein the metablock is a logical group including the first one of the sub-blocks and the second one of the sub-blocks.

8. The storage device of claim 7, wherein the controller is further configured to form the metablock in response to identifying an error in a third one of the sub-blocks in the one of the planes and a fourth one of the sub-blocks in the another one of the planes.

9. The storage device of claim 7, wherein the controller is configured to form the metablock in response to identifying an error in a first metablock including the first one of the sub-blocks and in a second metablock including the second one of the sub-blocks.

10. The storage device of claim 7, wherein the one of the planes and the another one of the planes are in different dies.

11. The storage device of claim 10, wherein the memory further includes additional blocks in additional planes of the different dies, each of the additional blocks having a plurality of additional sub-blocks, and the metablock further includes two or more of the additional sub-blocks.

12. The storage device of claim 7, wherein the controller is further configured to program the different word line in the second one of the sub-blocks following the program failure in a third one of the sub-blocks.

13. The storage device of claim 7, wherein the metablock excludes the sub-blocks within error-free blocks.

14. A storage device, comprising:
a memory including a plurality of blocks in different planes, wherein each of the blocks includes a plurality of sub-blocks; and
a controller configured to link a first one of the sub-blocks in one of the planes with a second one of the sub-blocks in another one of the planes to form a metablock, wherein the first one of the sub-blocks and the second one of the sub-blocks are associated with different sub-block addresses;
wherein the controller is further configured to program different word lines in the first one of the sub-blocks and the second one of the sub-blocks during a write operation associated with the metablock;
wherein the metablock includes a logical address associated with the first one of the sub-blocks and the second one of the sub-blocks;
wherein the different word lines include a first word line in the first one of the sub-blocks and a second word line in the second one of the sub-blocks, the controller being further configured to program the second word line following a program failure associated with the first word line.

15. The storage device of claim 14, wherein the first one of the sub-blocks is in a first die and the second one of the sub-blocks is in a second die.

16. The storage device of claim 15, wherein the controller is configured to form the metablock in response to identifying an error in a third one of the sub-blocks in the first die and in a fourth one of the sub-blocks in the second die.

17. The storage device of claim 15, wherein the memory further includes additional blocks in additional planes of the first die and the second die, each of the additional blocks having a plurality of additional sub-blocks, and the metablock further includes two or more of the additional sub-blocks.

18. The storage device of claim 17, wherein the metablock excludes the additional sub-blocks that are part of error-free blocks.

19. The storage device of claim 14, wherein the program failure is in a third one of the sub-blocks.

* * * * *